United States Patent [19]

Jaffee et al.

[11] Patent Number: 5,150,415
[45] Date of Patent: Sep. 22, 1992

[54] VOLUME CONTROL CIRCUIT USING PULSE MODULATION

[75] Inventors: James I. Jaffee, West Palm Beach; Michael J. DeLuca, Boca Raton, both of Fla.

[73] Assignee: Motorola, Inc., Schaumburg, Ill.

[21] Appl. No.: 453,119

[22] Filed: Dec. 21, 1989

Related U.S. Application Data

[63] Continuation-in-part of Ser. No. 345,811, May 1, 1989, abandoned.

[51] Int. Cl.$^5$ .............................................. H03G 3/00
[52] U.S. Cl. .................................... 381/104; 340/636
[58] Field of Search ............... 381/104, 109; 340/692, 340/636

[56] References Cited

U.S. PATENT DOCUMENTS

| | | | |
|---|---|---|---|
| 4,178,556 | 12/1979 | Attwood | 330/251 |
| 4,205,578 | 6/1980 | Bagus | 84/1.24 |
| 4,314,236 | 2/1982 | Mayer et al. | 340/384 E |
| 4,382,251 | 5/1983 | Fujisawa | |
| 4,396,909 | 8/1983 | Suzuki | 340/384 E |
| 4,476,436 | 10/1984 | Koizumi et al. | 330/251 |
| 4,603,317 | 7/1986 | Gailbreath et al. | 340/354 E |
| 4,694,725 | 9/1987 | Seevers et al. | 381/104 |
| 4,797,932 | 1/1989 | Rohulich et al. | 381/104 |
| 4,803,437 | 2/1989 | Reusens | 307/261 |

OTHER PUBLICATIONS

National Semiconductor, LB18-1, "+5 to −15 volts DC converter", Jul. 1972.

Primary Examiner—Forester W. Isen
Attorney, Agent, or Firm—Vincent B. Ingrassia; Thomas G. Berry

[57] ABSTRACT

A volume control circuit for an audio transducer comprises a driver circuit driven by a first pulse rate signal to excite the audio transducer and render an audio signal at a desired volume and audio frequency corresponding to the first pulse rate signal, and a control circuit selectively activated to pulse modulate the excitation of the audio transducer during its pulsed excitation periods to alter the volume of the audio signal rendered by the audio transducer. In one embodiment, the control circuit includes a logical AND gate having as one input the first pulse rate signal and as another input a selected signal of either a second pulse rate signal or a signal representative of a logical one, the AND gate selectively activated to pulse rate modulate the first pulse rate signal with the second pulse rate signal which is preferably ultrasonic. In another embodiment, the AND gate may be coupled to a variable pulse rate signal to pulse rate modulate the first pulse rate signal to render the audio signal at a volume commensurate with the varied pulse rate. Various other alternate embodiments of the present invention are described all including the foregoing described volume control circuit.

25 Claims, 9 Drawing Sheets

VOLUME CONTROL CIRCUIT USING PULSE MODULATION

This is a continuation-in-part of application Ser. No. 07/345,811, filed May 1, 1989, now abandoned.

BACKGROUND OF THE INVENTION

The present invention relates to volume control of audio transducers in general, and more particularly, to a volume control circuit including a driver circuit for exciting an audio transducer with a pulse rate signal to render an audio signal at a desired volume and frequency corresponding to the pulse rate signal, and a control circuit selectively activated to pulse modulate the excitation of the audio transducer, thereby altering the volume of the audio signal rendered thereby.

The techniques of volume control are many and generally find application in general purpose radio receivers for altering the volume of the audio signal over the tunable frequency range thereof. General purpose radio receivers usually include sophisticated audio amplifier circuits for implementing two or four quadrant amplification. Typically, volume control is implemented by varying the gain of one or more of the amplifier stages. This variable gain technique generally requires complicated hardware, and because the audio amplifiers are operating in the linear region, the technique requires a great deal of operating power.

For more special purpose radio receivers, like paging receivers, for example, the audio transducer is driven at one or more fixed frequencies, generally on the order of 2 Khz or so, to provide an audio alert to the user of an incoming page signal. The paging variety of receivers are, for the most part, portable and battery powered. Thus, the criteria for implementing a volume control in a paging receiver is quite different from that of a general purpose tunable audio band radio receiver. This criteria includes the ability to adjust the volume of the audio signal (1) to be heard by the user above the sounds of the surrounding environment, (2) to be aesthetically pleasing (e.g. not too loud and free of whistles and/or buzzes) to the user and others in the close proximity, and (3) to reduce the drain on the battery source when it approaches the end of its useful battery life.

Some present volume control techniques include varying the frequency of the audio drive signal, but this causes an undesirable change in audio frequency as well. Another technique involves a manually controlled, mechanically switched resistor in series with the audio transducer to switch in and out a current limiting load resistance, but since the mechanical switch is manually operated and must carry the drive current of the audio transducer, it must be of a high quality and thus, expensive and cannot be electronically operated. Yet another technique of volume control involves the pulse width modulation of the audio drive signal, but this technique introduces harmonics in the audio range which affects the total quality of the audio signal with buzzing and whistling, for example. The pulse width modulation technique also requires sophisticated circuitry which increases part count, battery drain and cost. Still another technique, described in the U.S. Pat. No. 4,382,251 issued to Fujisawa on May 3, 1983 and assigned to Casio Computer Co., involves AM variation of the tone frequency of the audio drive signal, which technique has been found suitable for the piezo-electric buzzer type audio transducers.

The present invention proposes to avoid the drawbacks of the above mentioned volume control techniques and provide an inexpensive, low current drain circuit for controlling volume over a multiple of volume levels without harmonic generation in the audio range.

SUMMARY OF THE INVENTION

In accordance with the present invention, a volume control circuit for an audio transducer comprises a driver circuit which is governed by a first pulse rate signal to excite the audio transducer during pulse periods generated from the governing signal to render an audio signal at a desired volume and audio frequency corresponding to the first pulse rate; and a control circuit which is coupled to the driver circuit and selectively activated to pulse modulate the excitation of the audio transducer during the pulsed excitation periods, thereby altering the volume of the audio signal rendered by the audio transducer. In one embodiment, the control circuit includes a circuit, which may be a logical AND gate, selectively operative to pulse rate modulate the first pulse rate signal with a second pulse rate signal which is preferably ultrasonic.

In another embodiment, the control circuit may be governed by a variable pulse rate signal to pulse modulate the excitation of the audio transducer to render the audio signal at a volume commensurate with a varied pulse rate which is preferably in the ultrasonic range.

And yet another embodiment, the volume control circuit may be embodied in a battery powered electronic system including a battery source for powering the electronic system at a decaying voltage potential; and a means for monitoring the voltage potential of the battery source and for generating a threshold signal when the battery voltage potential has decayed below a predetermined threshold voltage potential. In this embodiment, the control circuit is activated by the threshold signal to pulse modulate the excitation of the audio transducer.

In still another embodiment of the present invention, the control circuit is embodied in a battery powered electronic system including a battery source for powering one portion of the electronic system at a first voltage potential; a DC-DC converter governed by a pulse width modulated pulse rate signal to convert the first voltage potential of the battery source to a second voltage potential for powering another portion of the electronic system wherein the pulse width of the modulated signal increases, commensurate with a decrease in the first voltage potential, to cause the converter to maintain the second voltage potential. In this embodiment, the control circuit is governed by the pulse width modulated pulse rate signal to pulse rate modulate the excitation of the audio transducer to render the audio signal at a volume commensurate with the pulse rate and pulse width of the pulse width modulated pulse rate signal.

In a still further embodiment of the present invention, the volume control circuit is embodied in an electronic receiver unit including a receiver for receiving and demodulating a signal transmitted from an external source to generate a received signal; a decoder for decoding address information from the received signal and determining whether or not to generate an alert annunciation based on the decoded address information; a clock means for generating a pulse rate signal; and wherein the audio transducer is responsive to the decoder for generating an audio alert annunciation. In this embodiment, the volume control circuit comprises a first programmable pulse rate divider to divide the pulse rate signal down to a first pulse rate signal; a second programmable pulse rate divider to divide the pulse rate signal down to a second pulse rate signal; and a means responsive to the decoder for programming the first and second programmable pulse rate dividers. The driver circuit is governed by the first pulse rate signal to excite the audio transducer, and the control circuit is activated by the decoder to pulse rate modulate the excitation of the audio transducer with the second pulse rate signal.

DESCRIPTION OF THE PREFERRED EMBODIMENT

Figure 1:
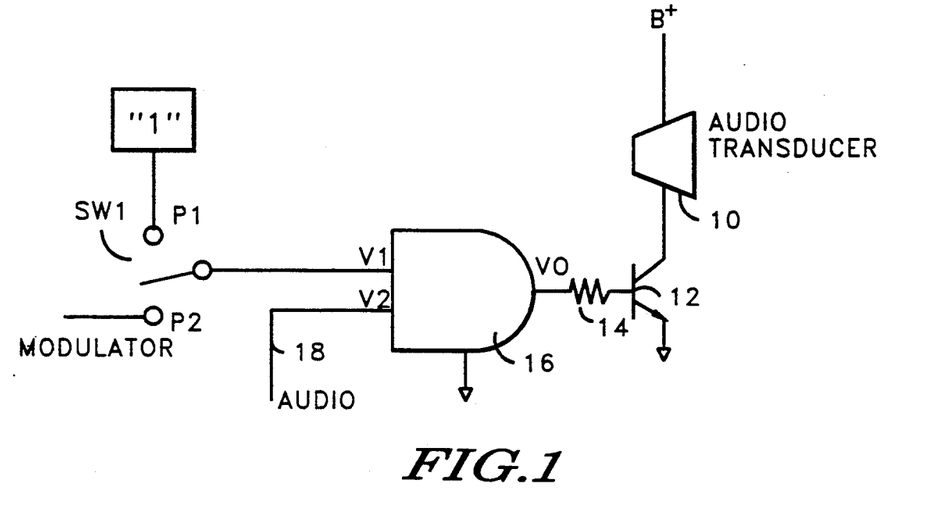
FIG. 1 is a circuit schematic of a volume control circuit suitable for embodying the broad principles of the present invention.

FIG. 1 depicts a volume control circuit suitable for embodying the broad principles of the present invention. Referring to FIG. 1, an audio transducer 10, which may be an audio speaker of the conventional electro mechanical type, for example, is coupled between a power source B+ and a driver circuit which in the present embodiment is implemented by a single NPN transistor 12. The audio transducer 10 is coupled to the collector of transistor 12 and the emitter thereof is coupled to a common potential. In addition, a current limiting resistor may be coupled to the base of transistor 12. In the present embodiment, the transistor 12 is operated as a switching transistor, that is, it may be operated in only one of two states either "on" and conducting current through the audio transducer 10, or "off" and not conducting or blocking current from flowing through the audio transducer 10.

Coupled to the driver circuit 12 is a control circuit which is implemented, in the present embodiment, by a two-input AND gate 16 having an output coupled to the resistor 14 for driving the transistor 12 to excite the audio transducer 10. Coupled to one input of the AND gate 16 is a first pulse rate signal or audio signal over signal line 18.

When the other input of the AND gate 16 is selectively coupled to a voltage potential representative of a logical 1, the driver circuit 12 is driven by the first pulse rate signal to excite the audio transducer 10 during pulse periods generated from the driving signal to render an audio signal at a desired volume and audio frequency corresponding to the first pulse rate. An illustration of a first pulse rate signal suitable for the present embodiment is shown by waveform B of FIG. 2. For example, the audio transducer 10 may be excited during the interval of the pulses 20 of the first pulse rate signal by driving transistor 12 into conduction for the duration of such intervals. Conversely, during the interpulse periods 22, transistor 12 is not conducting and audio transducer 10 is unexcited.

To provide selective activation of the control circuit 16, in the present embodiment, a single pole, double throw switch SW1 is coupled to the other input of the AND gate 16. Coupled to switch position P1 is a voltage potential representative of a logical 1 and coupled to the other position P2 is a second pulse rate signal or modulation signal. Accordingly, when switch SW1 couples the logical 1 reference voltage to the AND gate 16 the foregoing described operation takes place. However, when the switch SW1 is positioned to couple the modulation signal to the AND gate 16, then the control circuit is activated to pulse modulate the excitation of the audio transducer during the pulse excitation periods of the audio signal, thereby altering the volume of the audio signal rendered by the audio transducer 10. An illustration of this pulse modulation technique is shown by the waveforms A,B, and C of FIG. 2.

Figure 2:
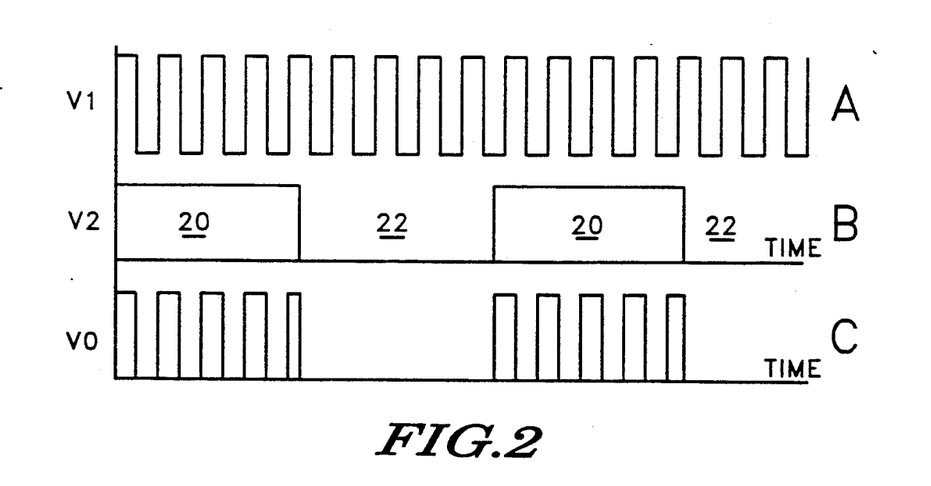
FIG. 2 includes waveforms A, B, and C illustrative of the operation of the volume control circuit of FIG. 1.

Referring to FIG. 2, a second pulse rate signal or modulation signal suitable for the present embodiment is illustrated by waveform A. When the signals, illustrated by waveforms A and B, are coupled to the inputs of the AND gate 16 the resultant pulse modulated signal, illustrated by waveform C, is used to govern the driver circuit 12 and excite audio transducer 10. For the present embodiment, it is preferred that the modulation signal be ultrasonic.

While the foregoing described embodiment provides for selectively activating a control circuit to reduce the volume of the audio signal rendered by the audio transducer 10, it is understood that, in an alternate embodiment, the pulse rate of the modulation signal may be varied to alter the volume commensurately with the varied pulse rate thereof. For example, if switch SW1 was positioned at P2, the volume of the audio signal may be controlled in accordance with the pulse rate of the modulation signal.

Figure 3:
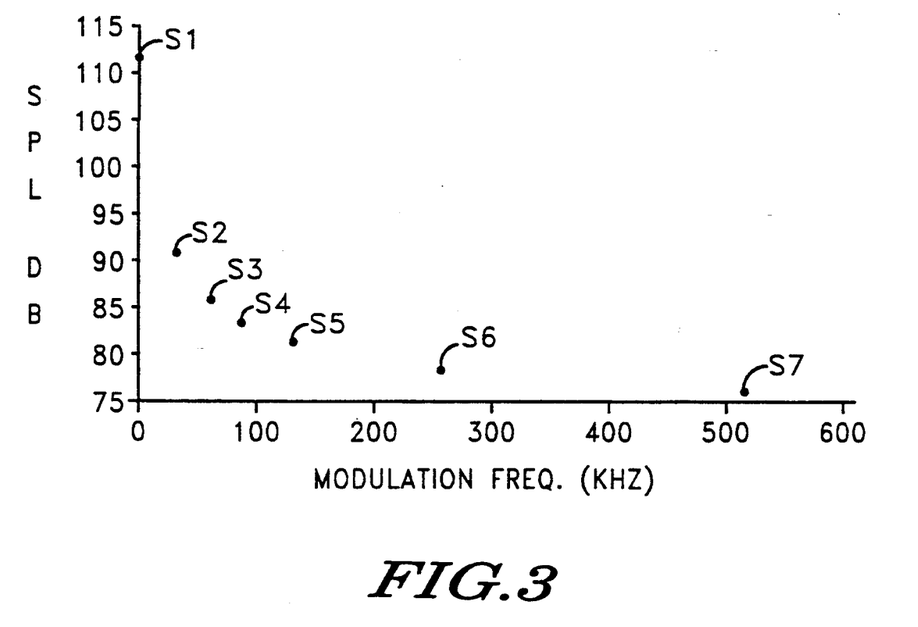
FIG. 3 is a graph depicting exemplary operational results of a typical volume control circuit governed by a variable pulse rate modulation signal.

FIG. 3 and corresponding Table I found here below provide an example of variation in volume of the audio transducer in response to a change in modulation pulse rate or frequency. In the present example, measurements in decibels (DB) were taken of the sound pressure level (SPL) of an audio transducer with a conventional SPL meter as the pulse rate of the modulation signal was discretely varied from one sample to another. A conventional electro mechanical audio speaker, manufactured for Motorola bearing Part No.50D05056G01, having the characteristics of drawing 32MA at substantially 1.5 V at a pulse rate of 2.66 KHz, was used as the audio transducer.

Referring to FIG. 3, the first sample S1 illustrates the sound pressure level of the audio transducer driven by an unmodulated audio pulse rate signal; see waveform B in FIG. 2, for example. In sample S2, the audio pulse rate signal was pulse modulated (waveform C in FIG. 2) with a modulation signal having a frequency of 32 KHz, i.e. ultrasonic, which resulted in a substantial reduction in volume as measured by the SPL of the audio transducer. Similarly, the remaining samples S3–S7 resulted in further alteration of the SPL (volume) of the audio transducer as shown by FIG. 3 and Table I. Also shown in Table I, are example measurements of the transducer current being drawn from the source B+ at each of the sampled modulation frequencies. Note that there is a commensurate reduction in transducer drive current as the modulation frequency is increased.

TABLE I

| SAMPLE | MODULATION FREQUENCY (KHZ) | SPL (DB) | TRANSDUCER CURRENT (MA) |
|---|---|---|---|
| S1 | 0 | 112 | 26.98 |
| S2 | 32 | 91 | 3.09 |
| S3 | 64 | 85 | 2.2 |
| S4 | 83 | 83.5 | 1.95 |
| S5 | 128 | 83.5 | 1.62 |
| S6 | 256 | 78 | 1.2 |
| S7 | 512 | 76 | 0.99 |

Figure 4:
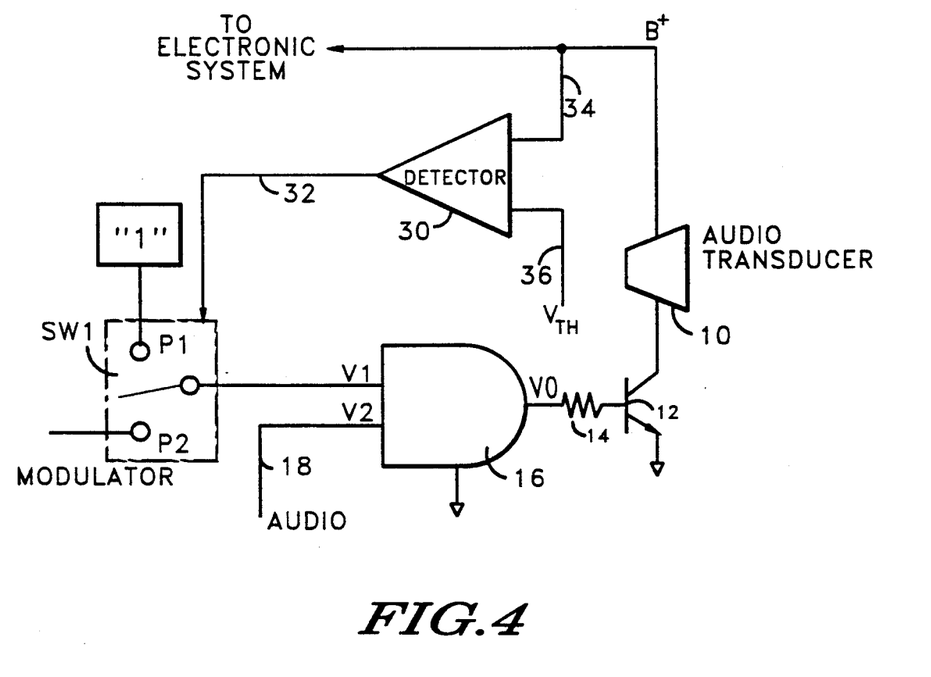
FIG. 4 is a circuit schematic depicting an alternate embodiment of the present invention including the volume control circuit of FIG. 1.

FIG. 4 depicts an alternate embodiment of the present invention in which an electronic system, such as a paging receiver, for example, is powered by a battery source B+, and the voltage potential of the battery source is caused to decay as the battery source nears the end of its useful life. In this alternate embodiment of FIG. 4, the volume control circuit, as described in connection with the embodiment of FIG. 1, further includes a threshold detector 30 for monitoring the voltage potential of the battery source B+ and for generating a threshold signal over a signal line 32 when the battery voltage potential has decayed below a predetermined threshold voltage potential.

In the present embodiment, a conventional comparator circuit with hysterisis may be used as the threshold detector having a signal representative of the voltage potential of the battery source coupled to one input thereof over a signal line 34 and a predetermined threshold voltage potential coupled to another input over a signal line 36. The output of the comparator circuit 30 may be coupled over signal line 32 to switch SW1 to control the switch position thereof. In operation, when the battery voltage potential is above the threshold level, switch SW1 may be positioned at P1 in which case the audio transducer 10 is excited solely by the audio pulse rate signal conducted through AND gate 16 to drive transistor 12. Conversely, as the battery voltage potential falls below the threshold level, the detector circuit 30 effects a threshold signal over signal line 32 to cause switch SW1 to be positioned at P2 which activates the pulse modulation of the audio pulse rate signal with the second pulse rate modulation signal.

Figure 5:
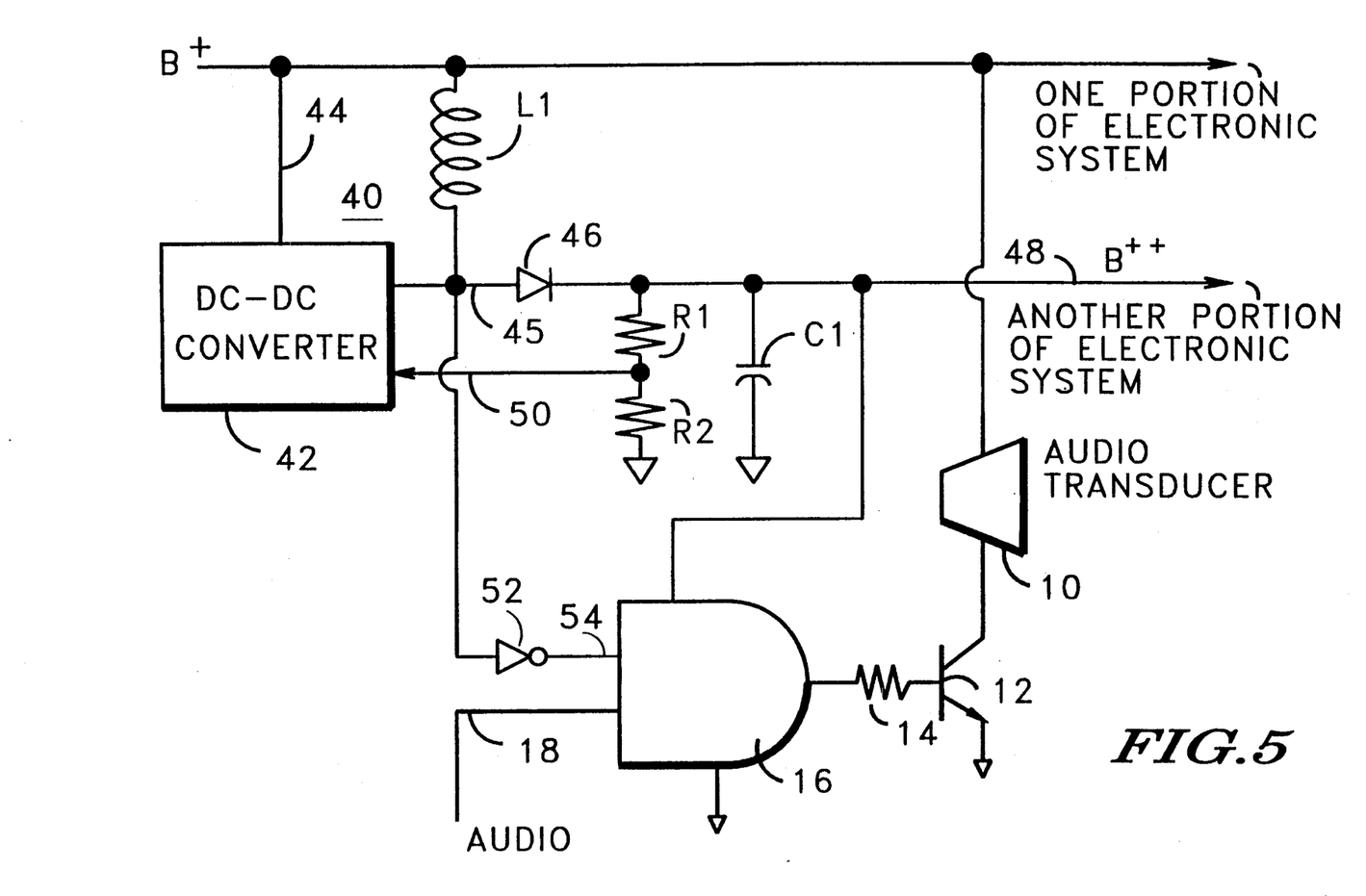
FIG. 5 is a circuit schematic of yet another embodiment of the present invention utilizing the volume control circuit of FIG. 1.

A further embodiment of the present invention is depicted in FIG. 5 in which the volume control circuit embodiment, described in connection with FIG. 1, is embodied in an electronic system including a battery source B+ for powering one portion of the electronic system, which may include the audio transducer 10, at a first voltage potential, and a DC-DC converter 40 which is operated by a pulse width modulated pulse rate signal to convert the first voltage potential of the battery source B+ to a second voltage potential B++ for powering another portion of the electronic system, which may include the control circuit 16. In the embodiment of FIG. 5, the battery source B+ is coupled to a converter control unit 42 over signal line 44. A pulse width modulated pulse rate signal say on the order of 83 KHz, for example, is generated by the control unit over signal line 45 which is coupled to the anode of a diode 46. The signal line 45 is also coupled to the battery source B+ through an inductor L1. The converted voltage potential is produced at the cathode of the diode 46 and supplied to another portion of the electronic system over signal line 48. Filtering is provided by a capacitor C1 coupled between signal line 48 and a common potential. Also, a resistor divider network comprising resistors R1 and R2 is coupled between signal line 48 and the common potential. A voltage at the node of resistors R1 and R2 is representative of the voltage potential of the source B++ and is coupled, as a feedback signal, to the control unit 42 over signal line 50.

In the present embodiment, the battery source voltage B+ may be on the order of the voltage of a conventional one-cell battery or approximately 1.3 V and the voltage potential of the converted signal B++ may be on the order of 3 V. In operation, the battery source signal B+ is chopped in time by a pulse width modulated pulse rate signal in the control unit 42 and the resulting signal is provided over signal line 45 through the diode 46 to create the increased voltage potential of the converted source B++. The feedback signal over signal line 50 regulates the pulse width of the modulated signal. Accordingly, as the voltage potential of the battery source B+ starts decaying the voltage potential at B++ decreases commensurately. The feedback signal 50 provides a measurement of the decrease in signal B++ and regulates the pulse width of the chopper signal in order to maintain the source B++ at its desired voltage level. For a more detailed description of a DC-DC converter circuit suitable for use in the present embodiment reference is made to the U.S. Pat. No. 4,355,277 issued to Davis et al. on Oct. 19, 1982 and assigned to the same assignee as the instant application. The aforementioned patent is incorporated by reference herein for providing such detailed description.

In the embodiment depicted in FIG. 5, the pulse width modulated pulse rate signal generated by the converter 40 over signal line 45 may be coupled to the other input of AND gate 16 through an inverter gate 52 over signal line 54. Thus, when activated, the volume of the audio signal may be controlled in accordance with both the pulse rate and pulse width of the pulse width modulated pulse rate signal of signal line 54, the pulse rate preferably being in the ultrasonic range.

Figure 6:
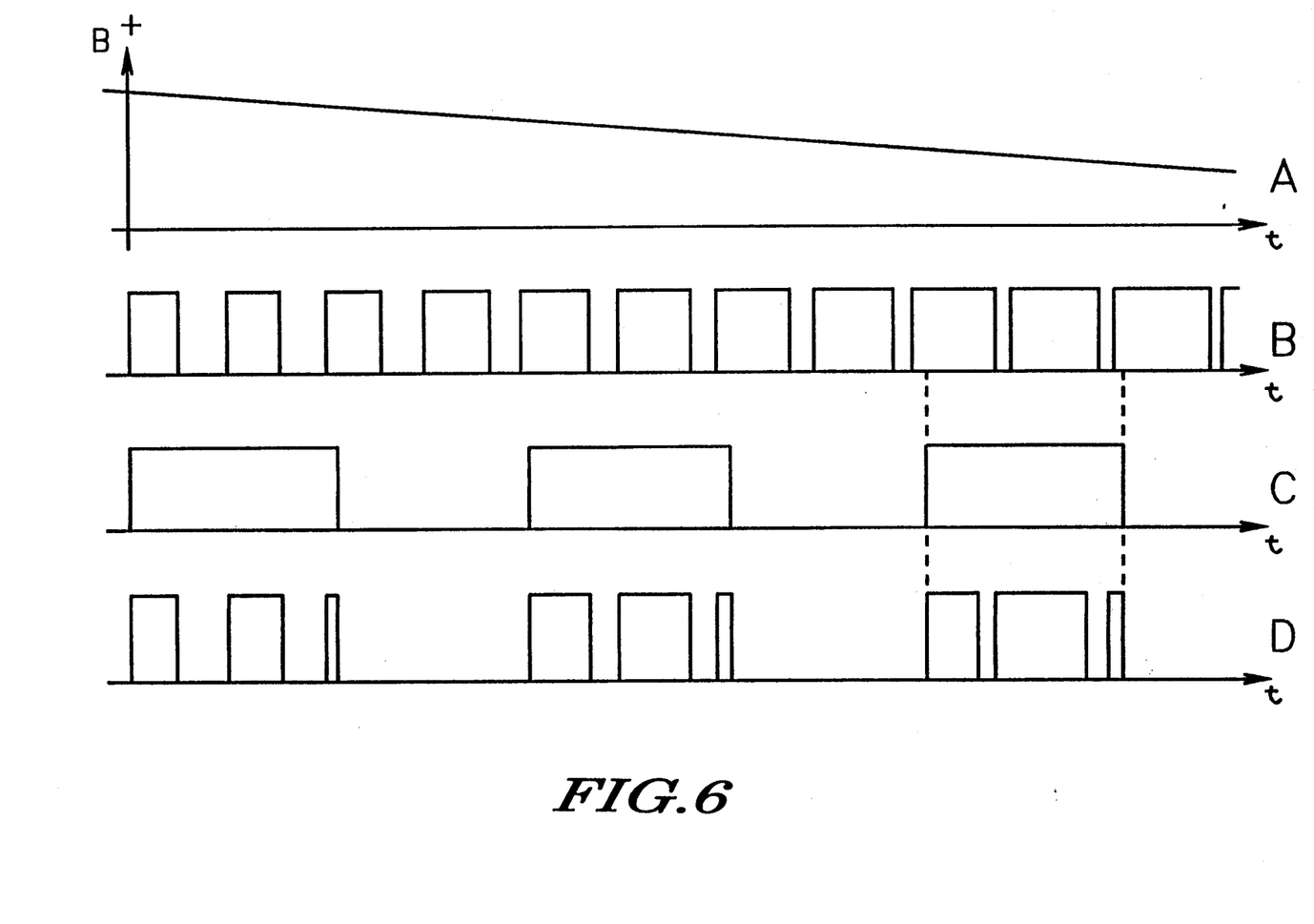
FIG. 6 includes waveforms A-D illustrative of the operation of the embodiment depicted in FIG. 5.

The wave forms A-D of FIG. 6 illustratively depict the operation described above in connection with the embodiment of FIG. 5. For example, waveform A depicts a continuously decaying voltage potential of the battery source B+ with time. Waveform B illustrates the pulse width modulated pulse rate signal coupled over signal line 54 to the AND gate 16. Waveform C illustrates the audio pulse rate signal coupled to the AND gate 16 over signal line 18 and finally, waveform D illustrates the resultant pulse modulation of the audio signal at the output of the AND gate 16 which governs via the driver transistor 12 the excitation of the audio transducer 10 to render the audio signal. Accordingly, the resultant waveform has the effect of maintaining a substantially constant volume of the audio signal rendered by the audio transducer even though the supply voltage of the transducer is decreasing as the battery source is discharging.

Figure 7:
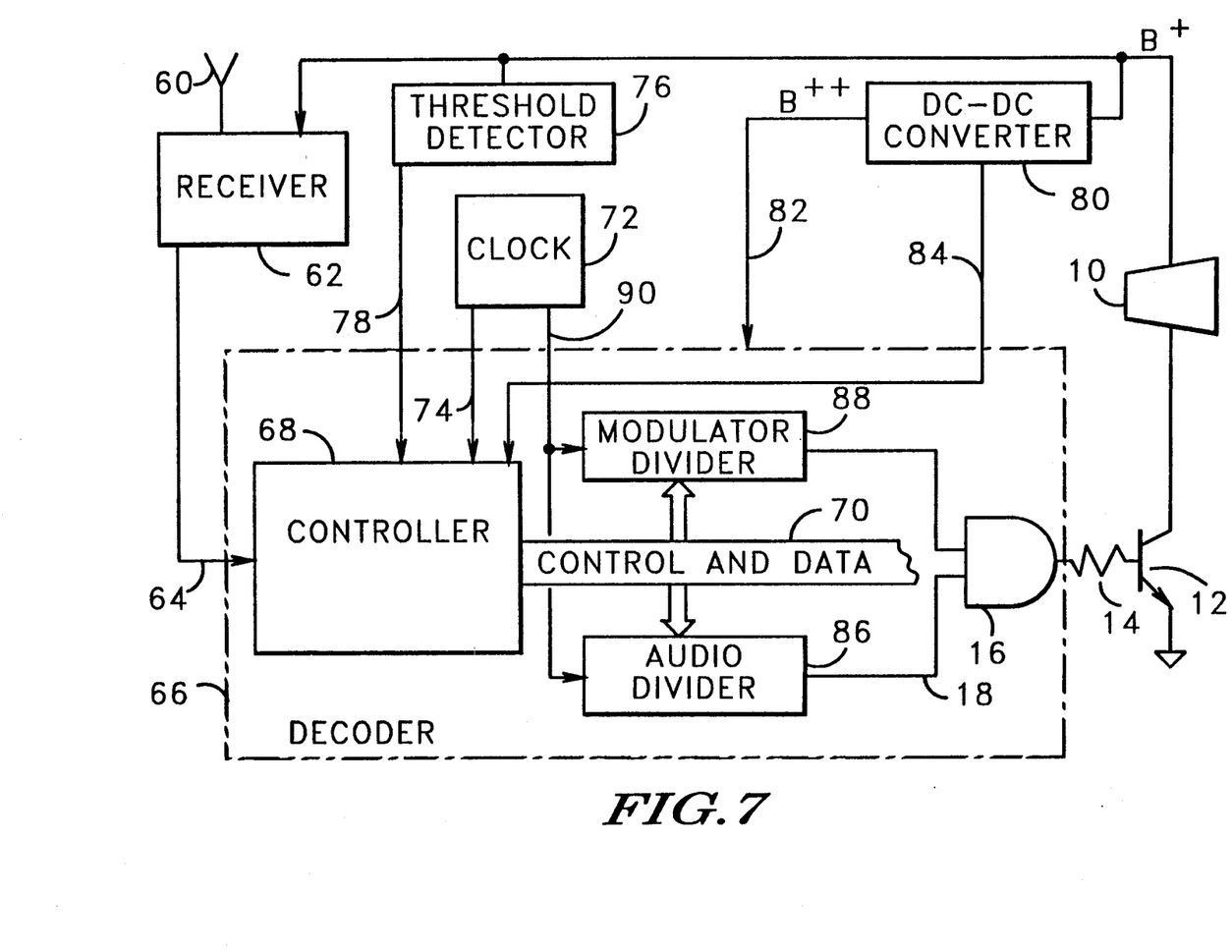
FIG. 7 is a block diagram schematic of a paging receiver suitable for illustrating a further embodiment of the present invention including the volume control circuit of FIG. 1.

In still a further embodiment of the present invention, the volume control circuit described in connection with FIG. 1 may be embodied in a paging receiver as shown in the block diagram schematic of FIG. 7. Referring to FIG. 7, a conventional paging antenna 60 is coupled to a receiver/modulator circuit 62 which in turn is coupled over signal line 64 to a decoder unit 66. The decoder 66 includes a controller unit 68 which may be a logical gate array in one embodiment or a programmed microcomputer in another. The controller 68 generates control and data signals over a bus 70 which may be distributed to other circuits of the decoder 66. A paging receiver suitable for use in the embodiment of FIG. 7 is described in greater detail in the U.S. Pat. No. 4,755,816, issued to M. DeLuca on Jul. 5, 1988 and assigned to the same assignee as the instant application, which is incorporated by reference herein.

The paging receiver embodiment of FIG. 7 further includes a clock circuit 72 which generates a plurality of clock signals, one of such generated signals being provided to the controller 68 over signal line 74; a threshold detector 76, similar to the threshold detector described in connection with the embodiment of FIG. 4, which is coupled to a battery source B+ and provides a threshold signal over signal line 78 to the controller 68; and a DC-DC converter 80, similar to the type described in connection with the embodiment of FIG. 5, which converts the battery source B+ into another source B++ at a higher voltage potential, which source may be used to supply power to the decoder unit 66 over signal line 82. The converter 80 may also provide a signal representative of its pulse width modulated pulse rate signal over signal line 84 to the controller 68. Still further, the battery source B+ may be used to power the receiver circuit 62 and the audio transducer 10.

In accordance with the instant embodiment of the present invention, two programmable pulse rate divider circuits 86 and 88 are further included in the decoder unit 66 of the paging receiver, the divider 86 for setting the pulse rate of the audio drive signal and divider 88 for setting the pulse rate of the modulation signal. Another of the generated clock signals of the clock 72 may be provided to the inputs of the dividers 86 and 88 over signal line 90. The outputs of the dividers 86 and 88 are coupled to corresponding inputs of the AND gate 16. In addition, the bus 70 is coupled to a programming input of each of the divider circuits 86 and 88.

In operation, the controller 68 may supply control and data information over the bus 70 to program a digital number into the audio divider circuit 86 which operates to divide the pulse rate signal supply thereto over signal line 90 down to the desired frequency of the audio signal. When the full volume of audio signal is desired, the modulator divider circuit 88 may be disabled by the controller 68 via bus 70 to render a voltage potential of a logical 1 at the corresponding input of the AND gate 16. In this mode, the audio pulse rate signal rendered by the divider circuit 86 solely governs the volume and frequency of the audio signal of the transducer 10. The controller 68 may also program a digital number into the modulator divider network 88 over the bus 70 utilizing the control and data lines thereof. Accordingly, the controller 68 may enable the modulator divider network 88 to divide the pulse rate signal supplied thereto over signal line 90 down to a modulation pulse rate signal which is coupled to the corresponding input of the AND gate 16 for pulse modulating the audio pulse rate signal. In this manner, the audio signal may be switchably reduced and/or varied in accordance with the digital number programmed into the divider circuit 88 via bus 70.

Further, a paging signal transmitted from an external source may be received by the pager's antenna 60 and demodulated by the receiver unit 62 using conventional demodulation circuits. Thereafter, the demodulated signal may be provided to the decoder unit 66 over signal line 64 for decoding address information therefrom. The decoder 66 using conventional methods shall determine whether or not to generate an alert annunciation based on the decoded address information. That is, if there is a correlation between the decoded address information and the pager's address, the controller 68 may enable the divider network 86 to provide an audio pulse rate signal through AND gate 16 to excite the audio transducer 10 using drive circuit 12. If it is determined that a reduction in audio signal volume is needed the controller 68 may further enable the divider circuit 88 to provide a second pulse rate signal to the AND gate 16 to pulse modulate the audio signal as described here above and render a reduced volume audio signal from the audio transducer 10.

In another aspect of the present embodiment, the controller 68 may be activated by the threshold signal 78 generated by the threshold detector 76 to activate the divider circuit 88 using similar principles as that described in connection with the embodiment of FIG. 4. Still further, a controller 68 may monitor the pulse width modulated signal of signal line 84 and control the pulse width of the pulse rate modulation signal of the divider 88 commensurately therewith utilizing the control and data lines of the bus 70.

Figure 8:
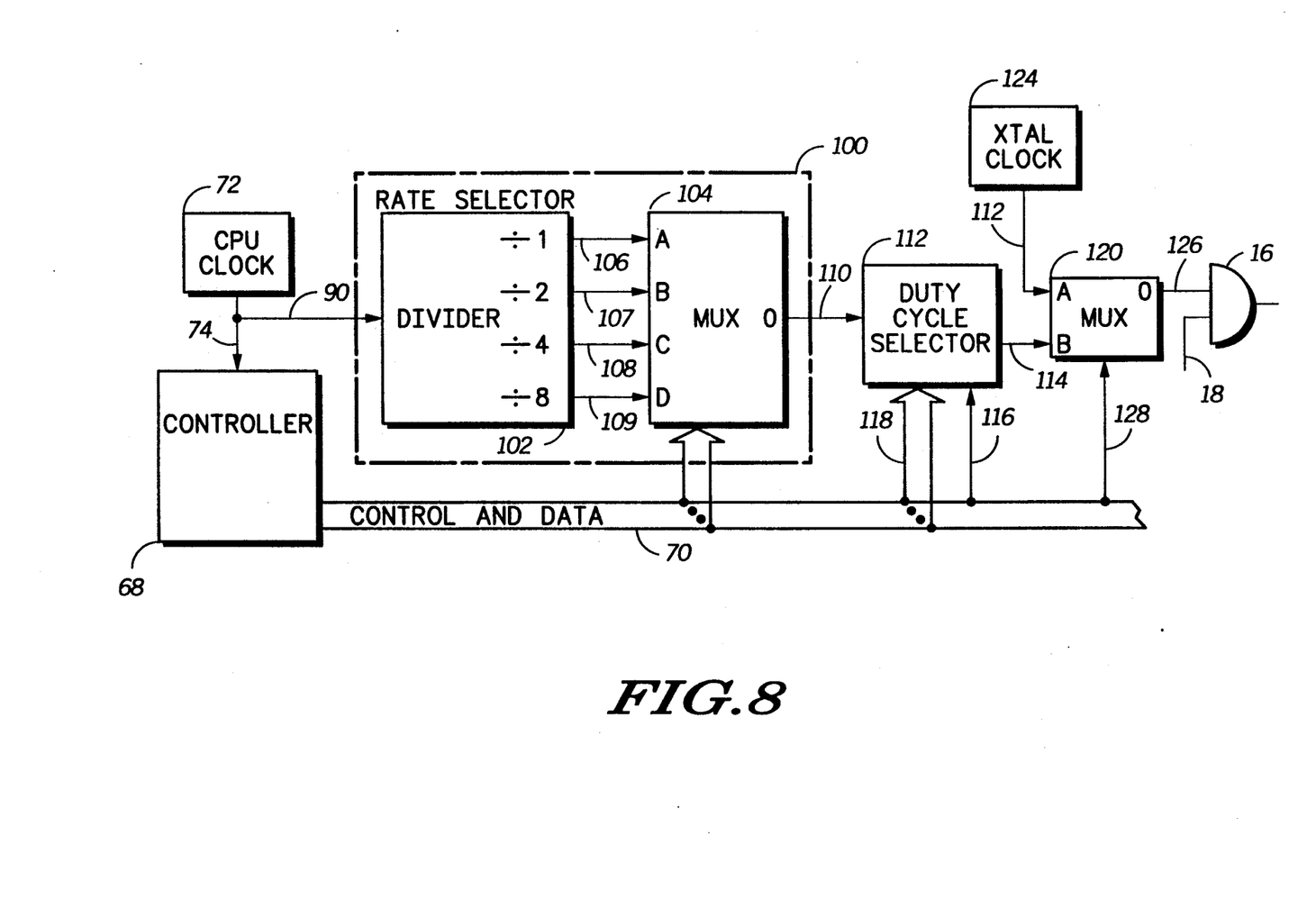
FIG. 8 is a block diagram schematic of a still further embodiment of volume control circuitry suitable for use in the paging receiver unit of FIG. 7.
Figure 9A:
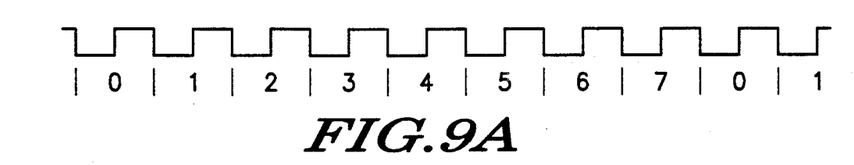
FIG. 9 includes digital waveforms A-I which exemplify the operation of the embodiment depicted in FIG. 8.
Figure 9B:
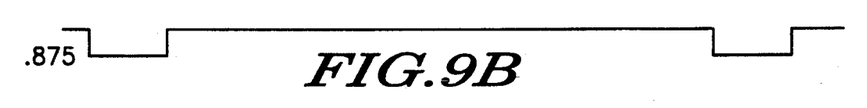
Figure 9C:
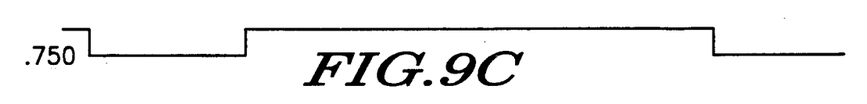
Figure 9D:
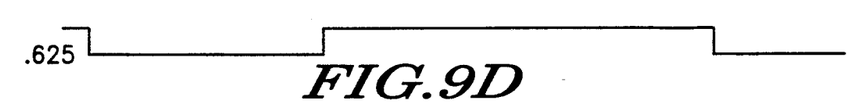
Figure 9E:
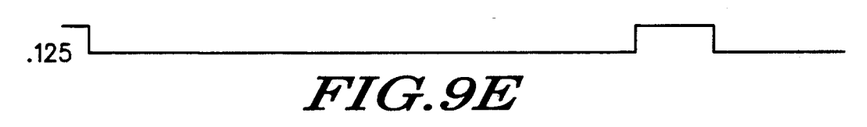
Figure 9F:
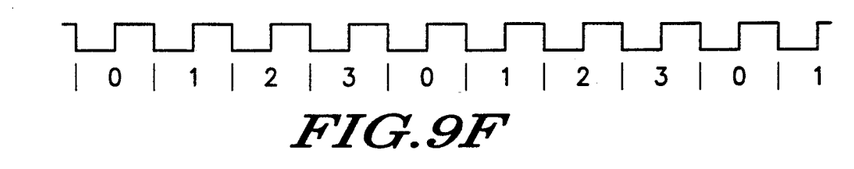
Figure 9G:
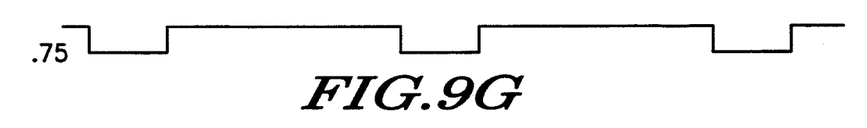
Figure 9H:
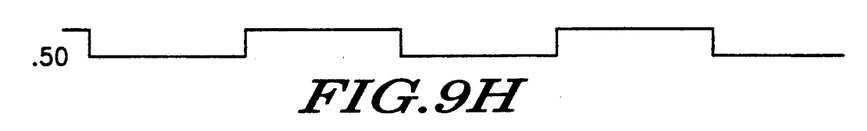
Figure 9I:
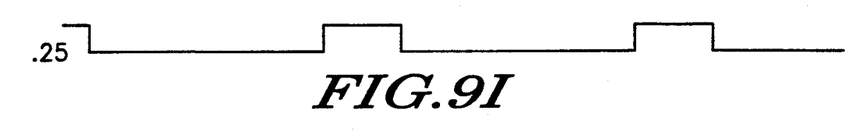

A still further aspect of the present invention is exemplified by the embodiment of FIG. 8 taken collectively with the electronic receiver embodiment of FIG. 7. Referring to FIG. 8, a pulse rate signal which may be generated by the CPU clock 72 is conducted over signal line 90 to a rate selector 100. The rate selector 100 includes a divider circuit 102 coupled to a multiplexer circuit 104. More specifically, the divider circuit 102 is responsive to the pulse rate signal of signal line 90 to produce a plurality of intermediate pulse rate signals 106-109 which have different sub-multiple pulse rates of the pulse rate signal. In the present example, signal 106 divides the pulse rate signal by 1, signal 107 divides it by 2, signal 108 divides it by 4, and signal 109 divides it by 8. The intermediate pulse rate signals 106-109 are coupled to the inputs A-D, respectively, of the multiplexer circuit 104. In the present embodiment, the multiplexer 104 is governed by the control and data signals 70 generated by the controller 68 to select one of the intermediate pulse rate signals 106-109 to be effected over its output line 110.

The embodiment of FIG. 8 further includes a duty cycle selector circuit 112 for pulse width modulating the selected pulse rate signal 110 to effect over signal line 114 a pulse width modulated pulse rate signal. In the present embodiment, the circuit 112 is governed by a control signal including a phase selection signal 116 and a duty cycle selection signal 118. In describing the operation of the duty cycle selector circuit 112, reference is made to the waveforms A-I of FIG. 9.

If the phase selection signal 116 is in a first state, the selected pulse rate signal of signal line 110 is considered to have eight phases 0-7 as shown by the waveform A of FIG. 9. On the other hand, if the control signal 116 is in a second state, the pulse rate signal 110 is considered to have four phases 0-3 as shown by the waveform F of FIG. 9. Once the phase selection is controlled by signal 116, then the duty cycle may be selected by the code of the signals 118. In the present example, for the eight-phase selection, the signals 118 may include three binary coded bits to vary the duty cycle from 0.125 as shown in waveform E through 0.625, 0.750, and 0.875 as shown in waveforms D, C, and B, respectively. For the four-phase case, only two binary bits are needed for the signals 118 to select the duty cycle through the selections 0.25, 0.50, and 0.75 as exemplified in the waveforms I, H, and G, respectively. Note that when the pulse rate signal 110 is selected to have eight phases, the pulse rate thereof is divided by eight when effected over the output line 114. Accordingly, when the pulse rate signal 110 is considered to have four phases by the signal 116, the pulse rate of the pulse width modulated signal over line 114 is one-fourth of the pulse rate signal 110.

Further in the present embodiment, the signal line 114 may be coupled to one input B of a multiplexer circuit 120, and the input A thereof may be coupled to a signal line 122 which may may carry another pulse rate signal generated by a crystal clock 124, for example. One of the signals at the inputs A or B of the multiplexer circuit 120 may be effected over the output line 126 thereof according to the selection governed by a mode control signal 128 taken from the data lines 70, for example. The signal line 126 is coupled to the modulated input of the AND gate 16 to pulse rate modulate the first pulse rate signal 18 to effect a volume control at the audio transducer which is measured in decibels commonly referred to as sound pressure level (SPL).

Figure 10:
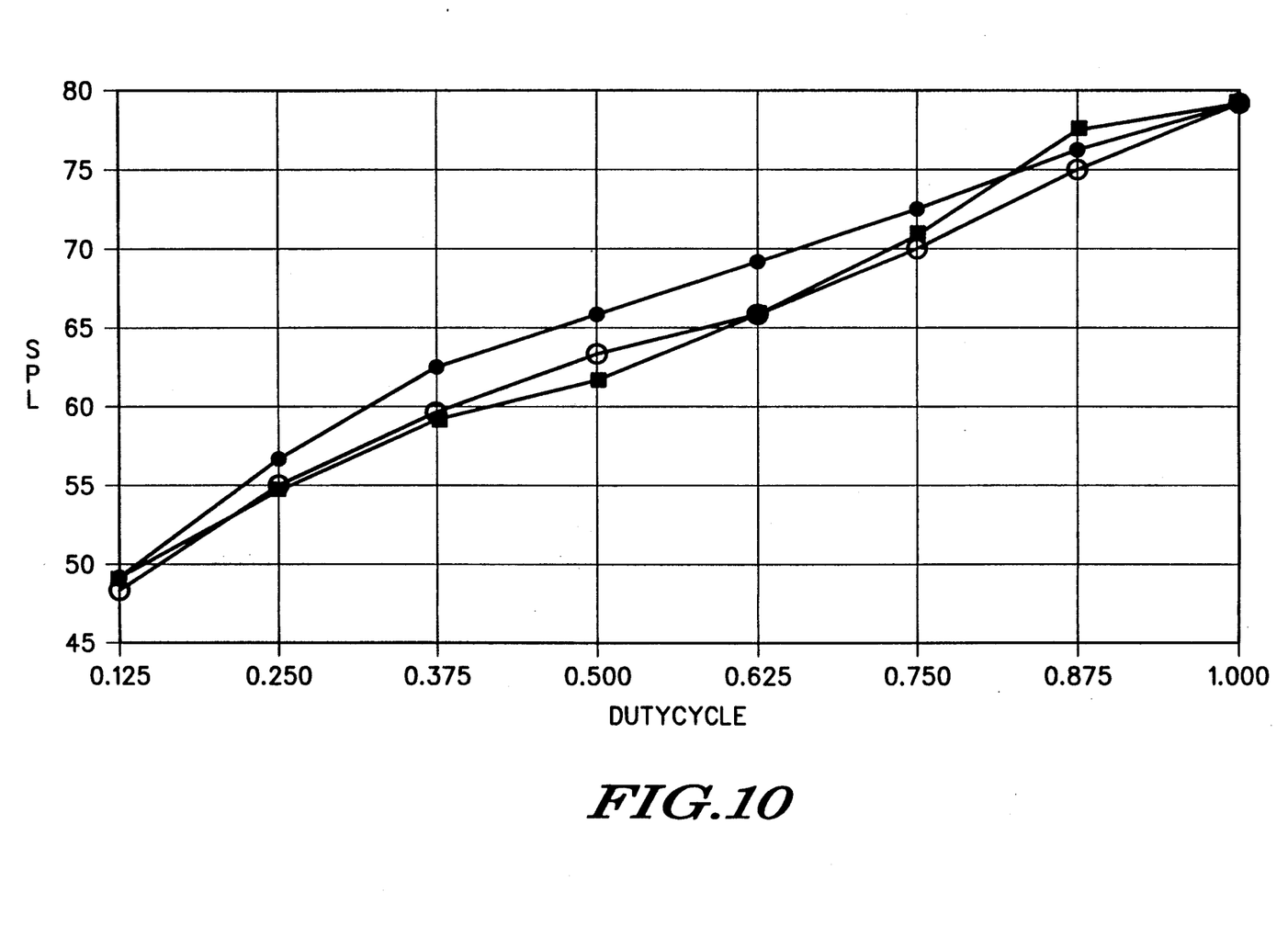
FIG. 10 is a graph of sampled measurements exemplifying the operation of the embodiment depicted in FIG. 8.

Examples of volume control of an audio transducer manufactured by Sanshin, bearing model number RC14/101 at a first pulse rate of 2670 Hz are shown in the graph of FIG. 10. The SPL of the audio transducer was measured at various pulse rates and duty cycle selections as shown in Table II below and also in the graph of FIG. 10. More specifically, the graph line of FIG. 10 drawn using the sampled measurements depicted by the solid circles refers to a modulated pulse rate of 32 KHz, the graph line drawn using the sampled measurements depicted by the undarkened circles refers to a modulated pulse rate of 64 KHz, and finally, the graph line drawn using the sampled measurements of the darkened blocks refers to a modulated pulse rate of 128 KHz. It is recognized that the duty cycle variation of the pulse rate modulated signal varies the SPL substantially linear with regard to the scaling of the graph of FIG. 10 independent of the pulse rate modulation.

TABLE II

| DUTY CYCLE | 32 KHZ MOD. | 64 KHZ MOD. | 128 KHZ MOD. |
|---|---|---|---|
| 0.125 | 49.5 | 48.4 | 49.8 |
| 0.250 | 56.8 | 54.9 | 54.5 |
| 0.375 | 62.7 | 59.8 | 58.5 |
| 0.500 | 66.1 | 63.4 | 62.1 |
| 0.625 | 69.4 | 66.1 | 65.9 |
| 0.750 | 72.7 | 70.2 | 71.1 |
| 0.875 | 76.6 | 75.2 | 77.8 |
| 1.000 | 79.2 | 79.2 | 79.2 |

In summary, then, the controller 68 may select one of the intermediate pulse rate signals 106-109 as the pulse rate signal input to the duty cycle selector 112. In addition, the controller 68 may also govern the phase and duty cycle selection of the pulse rate signal of signal line 110 utilizing the control and data lines 70 via 116 and 118. The resulting pulse width modulated pulse rate signal may be conducted over signal line 126 via MUX 120 to the modulation input of the AND gate 16 under control of the mode control signal 128 which may also be controlled by the controller 68 via the control and data lines 70. The mode control signal 128 may also select the pulse rate signal of signal line 122 through the multiplexer 120 to be the modulation input of the AND gate 16.

While the present invention has been described in accordance with a plurality of embodiments, it is understood that all such embodiments may be modified to yield an equivalently operating further embodiment including a software embodiment without deviating from the principles of the present invention. Therefore, the present invention should not be limited to any or all of the foregoing described embodiments, but rather construed in breath and broad scope in accordance with the recitation of the appended claims.

What is claimed is:

1. A volume control circuit for an audio transducer comprising:
   driver circuit governed by a governing signal having a periodic rate to excite the audio transducer during pulsed periods generated from said governing signal to render an audio signal at a desired volume and audio frequency corresponding to said periodic pulse rate of said governing signal; and
   control circuit coupled to said driver circuit and selectively activated to at least pulse rate modulate the excitation of the audio transducer during said pulsed periods generated from said governing signal to alter the excitation of the audio transducer thereby altering the volume of the audio signal rendered by the audio transducer.

2. The volume control circuit in accordance with claim 1 wherein the control circuit includes a circuit selectively governed by a second periodic pulse rate signal to at least pulse rate modulate the governing signal with said second periodic pulse rate signal, said second periodic pulse rate being greater than the pulse rate of the governing signal; and wherein the driver circuit is governed by said pulse rate modulated first pulse rate signal.

3. The volume control circuit in accordance with claim 2 wherein the second periodic pulse rate is ultrasonic.

4. The volume control circuit in accordance with claim 2 wherein the pulse rate modulation circuit includes a logical AND gate having as one input the governing signal and as another input a selected signal of either the second periodic pulse rate signal or a signal representation of a logical one.

5. The volume control circuit in accordance with claim 1 including means for monitoring the potential of a battery powering the audio transducer, the control means being responsive to the battery monitoring means to pulse rate modulate the governing signal when the battery monitoring means determines that the battery potential is at least below a threshold.

6. The volume control circuit in accordance with claim 2 including means for pulse width modulating the second pulse rate signal to render a pulse width modulated second pulse rate signal which is used selectively to pulse rate modulate the first pulse rate signal.

7. An electronic receiver unit including a receiver for receiving an demodulating a signal transmitted from an external source to generate a receive signal; a decoder for decoding address information from said receive signal and determining whether or not to generate an alert annunication based on said decoded address information; a clock means for generating a pulse rate signal; an audio transducer responsive to said decoder for generating an audio alert annunication; and a volume control circuit comprising:

a first programmable pulse rate divider to divide said pulse rate signal down to a first pulse rate signal;

a second programmable pulse rate divider to divide said pulse rate signal down to a second pulse rate signal;

means responsive to said decoder for programming said first and second programmable pulse rate dividers;

driver circuit governed by said first pulse rate signal to excite the audio transducer during pulsed excitation periods generated from said governing signal to render an audio alert signal at a desired volume and audio frequency corresponding to said first pulse rate; and control circuit coupled to said driver circuit and activated by said decoder to pulse rate modulate the excitation of the audio transducer with said second pulse rate signal during said pulsed excitation periods, thereby altering the volume of the audio signal rendered by the audio transducer.

8. The receiver unit in a accordance with claim 7 including a battery source for powering said receiver unit at a decaying voltage potential, and means for monitoring the voltage potential of said battery source and for generating a threshold signal when the battery voltage potential has decayed below a predetermined threshold voltage potential; and wherein the control circuit is activated by the threshold signal to pulse rate modulate the excitation of the audio transducer.

9. A battery powered electronic system including: a battery source for powering said electronic system at a decaying voltage potential; and audio transducer; and a volume control circuit including:

means for monitoring the voltage potential of said battery source and for generating a threshold signal when the battery voltage potential has decayed below a predetermined threshold voltage potential;

driver circuit governed by a first pulse rate signal to excite the audio transducer during pulsed excitation periods generated from said governing signal to render an audio signal at a desired volume and audio frequency corresponding to said first pulse rate; and control circuit coupled to said driver circuit and activated by said threshold signal to pulse width modulate or pulse rate modulate the excitation of the audio transducer during said pulsed excitation periods, thereby altering the volume of the audio signal rendered by the audio transducer.

10. The volume control circuit in accordance with claim 9 wherein the control circuit includes a circuit activated by the threshold signal to pulse rate modulate the first pulse rate signal with a second pulse rate signal, said second pulse rate being greater than the first pulse rate; and wherein the driver circuit is governed by said pulse rate modulated first pulse rate signal.

11. The volume control circuit in accordance with claim 10 wherein the second pulse rate is ultrasonic.

12. A battery powered electronic system including: a battery source for powering one portion of said electronic system at a first voltage potential; a DC-DC converter governed by a pulse width modulated signal to convert said first voltage potential of said battery source to a second voltage potential for powering another portion of said electronic system, the pulse width of said pulse width modulated signal increasing, commensurate with a decrease in said first voltage potential, to cause said converter to maintain said second voltage potential; an audio transducer; and a volume control circuit comprising:

a driver circuit governed by a governing signal having a periodic pulse rate to excite the audio transducer during periodic pulse periods generated from said governing signal to render an audio signal at a desired volume and audio frequency corresponding to said pulse rate of said governing signal; and a control circuit coupled to said driver circuit and governed by a signal representative of said pulse width modulated signal to either pulse rate modulate or pulse width modulate the excitation of the audio transducer during said periodic pulse periods to render the audio signal at a volume determined at least by said pulse width modulated signal.

13. The system in accordance with claim 12 wherein the pulse rate of the pulse width modulated signal is ultrasonic.

14. A volume control circuit for a battery powered audio transducer circuit comprising:

driver circuit governed by a governing signal to excite the audio transducer during pulsed excitation periods generated from said governing signal to render an audio signal at a desired volume and audio frequency corresponding to said governing signal's pulse rate;

battery monitoring means for determining when the battery's potential is at least below a threshold; and control circuit coupled to said driver circuit and said battery monitoring means and being governed by a variable pulse rate signal to pulse modulate the excitation of the audio transducer during said pulsed excitation periods to alter the volume of the audio signal when said battery monitoring means determines that the battery's potential is at least below the threshold.

15. The volume control circuit in accordance with claim 14 wherein the control circuit includes a circuit for pulse rate modulating the governing signal with the variable pulse rate signal, the varied pulse rate being greater than the governing signal's pulse rate.

16. The volume control circuit in accordance with claim 15 wherein the pulse rate modulating circuit includes a logical AND gate having as one input the governing signal and as another input the variable pulse rate signal.

17. The volume control circuit in accordance with claim 15 including means for pulse width modulating the variable pulse rate signal to render a pulse width modulated variable pulse rate signal which is used to pulse rate modulate the first pulse rate signal.

18. The volume circuit in accordance with claim 14 wherein the varied pulse rate is ultrasonic.

19. An electronic receiver unit including a receiver for receiving and demodulating a signal transmitted from an external source to generate a receive signal; a decoder for decoding address information from said receive signal and determining whether or not to generate an alert annunciation based on said decoded address information; and audio transducer responsive to said decoder for generating an audio alert annunication; and a volume control circuit comprising:

means for generating a first pulse rate signal;

means for generating a second pulse rate signal;

means governed by a first control signal to vary the pulse width of said second pulse rate signal to render a pulse width modulated second pulse rate signal;

driver circuit governed by said first pulse rate signal to excite the audio transducer during pulse periods generated from said governing signal to render an audio alert signal at a desired volume and audio frequency corresponding to said first pulse rate; and control circuit coupled to said driver circuit and activated by said decoder to pulse rate modulate the excitation of the audio transducer with said pulse width modulated second pulse rate signal during said pulsed excitation periods, thereby altering the volume of the audio signal rendered by the audio, transducer.

20. The electronic receiver unit in accordance with claim 19 wherein the volume control circuit includes:

means governed by a second control signal to vary the pulse rate of the second pulse rate signal to render a varied second pulse rate signal; and wherein the pulse width varying means varies the pulse width of the varied second pulse rate signal as governed by the first control signal.

21. The electronic receiver unit in accordance with claim 20 wherein the pulse rate varying means includes:

a divider circuit responsive to the pulse rate signal for generating a plurality of intermediate pulse rate signals, each having a different sub-multiple pulse rate of the pulse rate signal; and a multiplexer circuit governed by the second control signal for selecting one of the plurality of intermediate pulse rate signals as the varied second pulse rate signal.

22. The electronic receiver unit in accordance with claim 21 wherein the pulse width varying means includes a duty cycle selector circuit governed by the first control signal to vary the duty cycle of the varied second pulse rate signal to render the pulse width modulated varied second pulse rate signal.

23. The electronic receiver unit in accordance with claim 20 wherein the encoder includes a controller for generating the first and second control signals to govern the pulse width and pulse rate varying means, respectively.

24. The electronic receiver unit in accordance with claim 19 wherein the control circuit includes a logical AND gate having as inputs the first and second pulse rate signals.

25. The electronic receiver unit in accordance with claim 19 wherein the pulse width varying means includes a duty cycle selector circuit governed by the first control signal to vary the duty cycle of the varied second pulse rate signal to render the pulse width modulated varied second pulse rate signal.

* * * * *